United States Patent
Yang

(10) Patent No.: US 8,587,100 B2
(45) Date of Patent: Nov. 19, 2013

(54) LEAD FRAME AND SEMICONDUCTOR PACKAGE USING THE SAME

(75) Inventor: Wang-Lai Yang, Zhongshan (CN)

(73) Assignee: Ambit Microsystems (Zhongshan) Ltd., Zhongshan (CN)

(*) Notice: Subject to any disclaimer, the term of this patent is extended or adjusted under 35 U.S.C. 154(b) by 206 days.

(21) Appl. No.: 13/069,390

(22) Filed: Mar. 23, 2011

(65) Prior Publication Data

US 2011/0309484 A1  Dec. 22, 2011

(30) Foreign Application Priority Data

Jun. 17, 2010  (CN) .................. 2010 2 0227667 U

(51) Int. Cl.
*H01L 23/495*  (2006.01)

(52) U.S. Cl.
USPC ........................................ 257/676; 257/666

(58) Field of Classification Search
USPC .................. 257/666, 676, 787, 686, 777
See application file for complete search history.

(56) References Cited

U.S. PATENT DOCUMENTS

| | | | | |
|---|---|---|---|---|
| 7,495,319 B2* | 2/2009 | Fukuda et al. | | 257/666 |
| 7,633,141 B2* | 12/2009 | Huber | | 257/666 |
| 7,772,681 B2* | 8/2010 | Joshi et al. | | 257/668 |
| 7,939,933 B2* | 5/2011 | Itou et al. | | 257/696 |
| 2004/0056338 A1* | 3/2004 | Crowley et al. | | 257/676 |
| 2009/0079051 A1* | 3/2009 | Amano et al. | | 257/676 |
| 2010/0140766 A1* | 6/2010 | Punzalan et al. | | 257/676 |
| 2012/0068323 A1* | 3/2012 | Tan et al. | | 257/676 |
| 2012/0306066 A1* | 12/2012 | Krishnan et al. | | 257/676 |

* cited by examiner

*Primary Examiner* — S. V. Clark
(74) *Attorney, Agent, or Firm* — Altis & Wispro Law Group, Inc.

(57) ABSTRACT

A semiconductor package includes a lead frame, a first chip, a second chip, a plurality of bonding wires and a mold compound. The lead frame includes a pad portion at a center of the frame and a plurality of lead portions. The pad portion and the plurality of lead portions collectively define a receiving portion. The first chip is securely received in the receiving portion. The second chip is mechanically attached to the first chip. The plurality of bonding wires electrically connect the second chip to the plurality of lead portions. The mold compound encapsulates the lead frame, the first chip, the second chip and the plurality of bonding wires to form the semiconductor package.

12 Claims, 6 Drawing Sheets

LEAD FRAME AND SEMICONDUCTOR PACKAGE USING THE SAME

BACKGROUND

1. Technical Field

The present disclosure relates to a lead frame for use in packages for mounting semiconductor elements. More particularly, the present disclosure relates to a lead frame used in a quad flat non-leaded package (QFN), and to a semiconductor package using the lead frame.

2. Description of Related Art

A semiconductor package typically comprises a substrate, a first chip, and a second chip. The first chip is disposed on the substrate and the second chip is disposed on the first chip, that is, the first chip is sandwiched between the substrate and the second chip. However, the semiconductor chip package has a big volume so as not to meet the development of miniaturized electronic products.

Therefore, a need exists in the industry to overcome the described limitations.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure is illustrated by way of examples and not by way of limitations in the figures of the accompanying drawings in which like references indicate similar elements. It should be noted that references to "an" or "one" embodiment in this disclosure are not necessarily to the same embodiment, and such references mean at least one.

Figure 1:
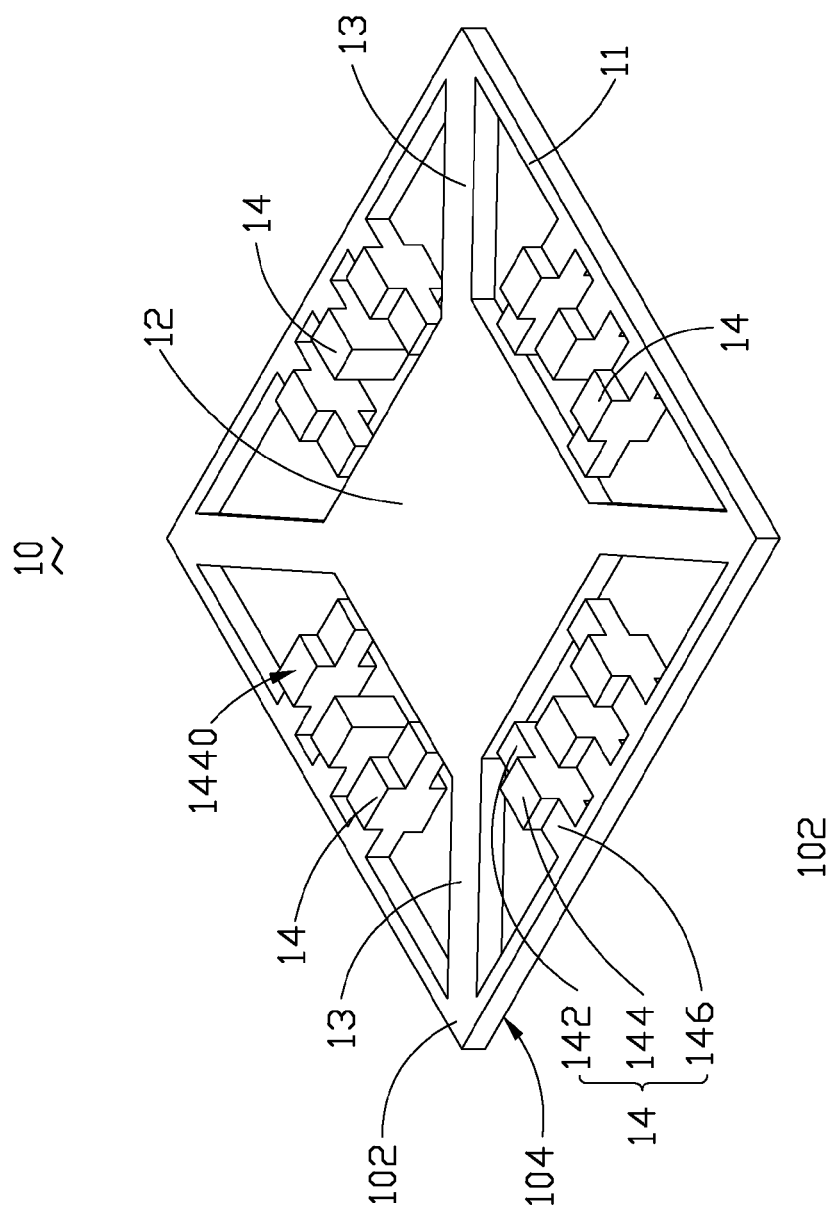
FIG. 1 is a perspective view of the embodiment of a first side of a lead frame in accordance with the present disclosure.

FIG. 1 is a perspective view of the embodiment of a first side of a lead frame 10 in accordance with the present disclosure. The lead frame 10 is used in packages for mounting semiconductor elements, where the packages may be quad flat non-leaded packages (QFN). The lead frame 10 comprises a frame portion 11 having a hollow rectangular structure, a pad portion 12 at a center of the frame portion 11, a plurality of support bars 13 connecting the pad portion 12 to four corners of the rectangular structure of the frame portion 11, and a plurality of lead portions 14 peripherally extending from four sides of the rectangular structure of the frame portion 11 towards the pad portion 12. In the illustrated embodiment, the frame portion 11, the pad portion 12, the plurality of support bars 13 and the plurality of lead portions 14 are integrally formed.

In the illustrated embodiment, the lead frame 10 is formed by etching or stamping a metal plate. For example, the metal plate may be made of a copper (Cu), a Cu-based alloy, an iron-nickel (Fe—Ni), a Fe—Ni-based alloy, or the like.

Figure 2:
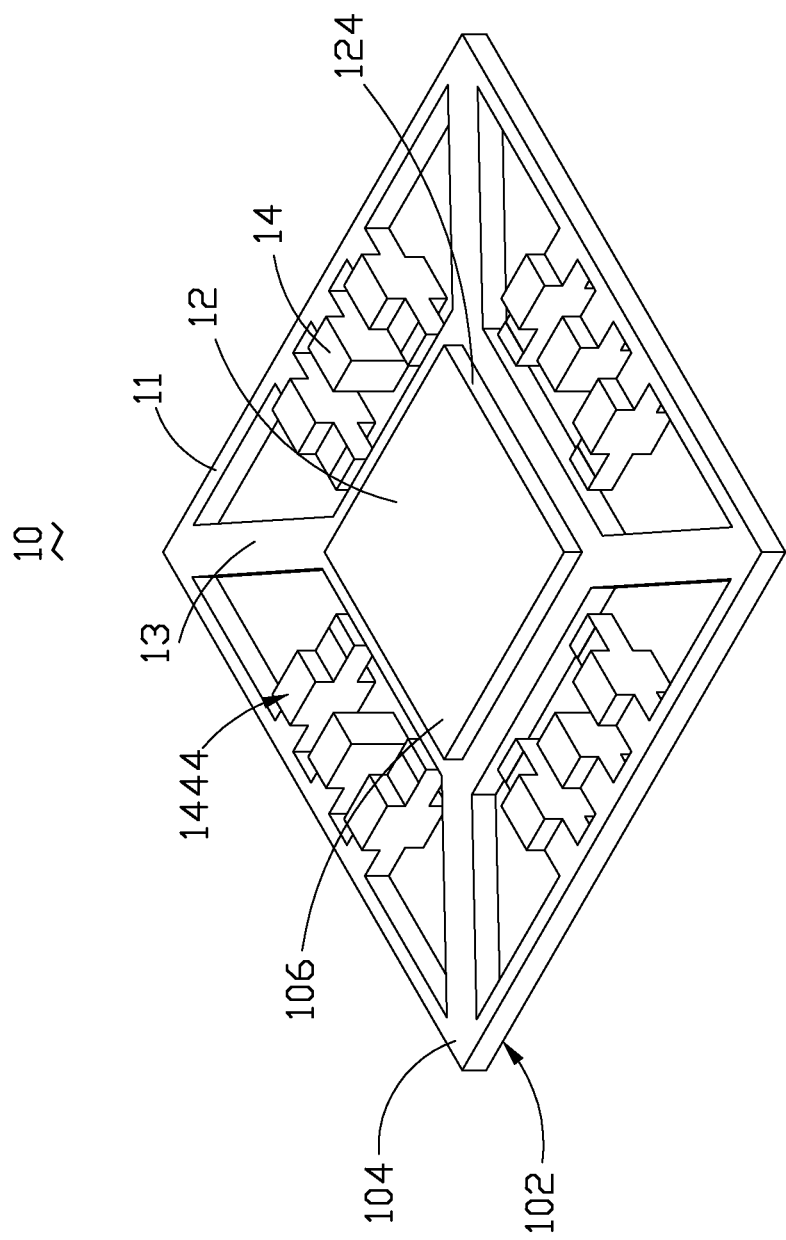
FIG. 2 is a perspective view of the embodiment of a second side of the lead frame in accordance with the present disclosure.

Referring to FIG. 2, the lead frame 10 comprises a first surface 102 and a second surface 104 opposite to the first surface 102. One sides of the frame portion 11, the pad portion 12 and the plurality of support bars 13 collectively form the first surface 102, another sides, opposite to said one sides, of the frame portion 11 and the plurality of support bars 13 collectively form the second surface 104, and another side of the pad portion 12 protrudes from the second surface 104.

The pad portion 12 is used to support the semiconductor elements, such as a chip, a memory assembly, a logic assembly, and other electronic elements. In the illustrated embodiment, the semiconductor element is supported on said one side of the pad portion 12, i.e., on the first surface 102. The pad portion 12 comprises a projection stage 124 protruding outwardly from the second surface 104 to prevent the pad portion 12 from distorting upon carrying the semiconductor elements. The projection stage 124 has a third surface 106 in parallel with the second surface 104.

Each of the plurality of lead portions 14 comprises a support end 142, a connecting terminal 144 and a jointing end 146. The jointing end 146 joints the frame portion 11 with the connecting terminal 144, and the connecting terminal 144 is disposed between the jointing end 146 and the support end 142. In the illustrated embodiment, the support end 142, the connecting terminal 144 and the jointing end 146 are integrally formed.

Figure 3:
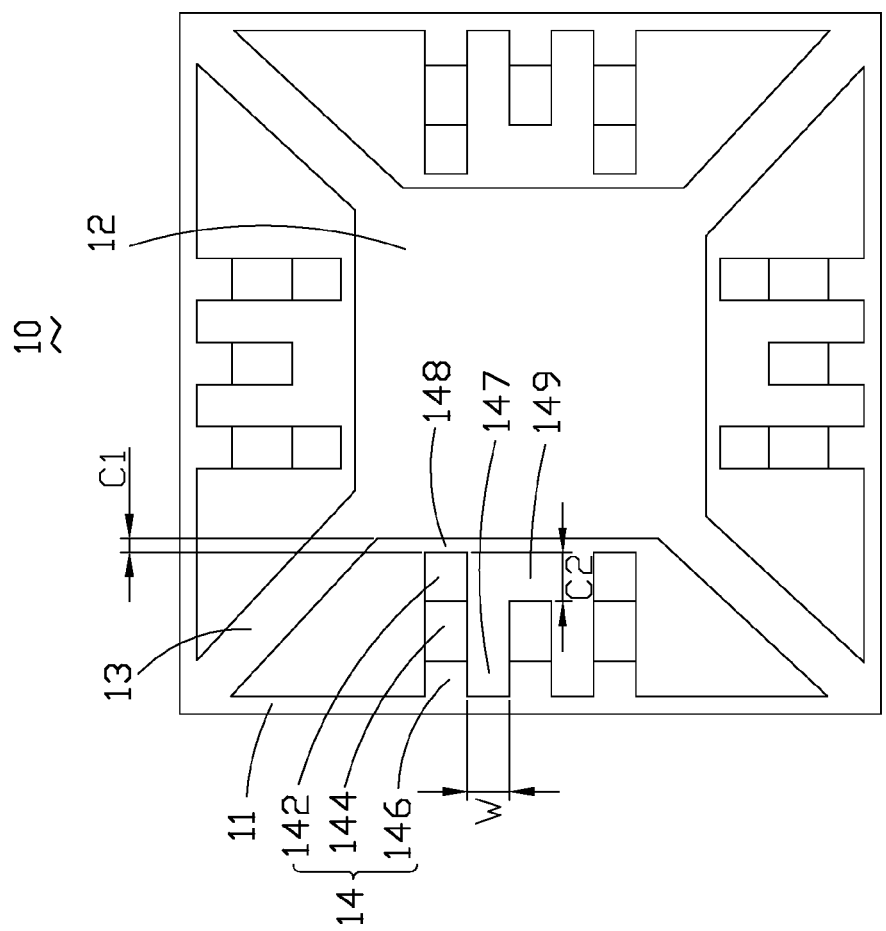
FIG. 3 is a planform of the embodiment of the lead frame in accordance with the present disclosure.

Referring to FIG. 3, in each receiving space defined by the frame portion 11, the pad portion 12 and the support bar 13, the plurality of lead portions 14 are spaced from each other with a first gap 147 of width W and spaced from the pad portion 12 with a second gap 148 of width C1. In the illustrated embodiment, in each receiving space, at least one lead portion 14 only comprises the jointing end 146 and the connecting terminal 144, and is spaced from the pad portion 12 with a third gap 149 of width C2. In the illustrated embodiment, value of C2 is greater than that of C1.

Figure 4:
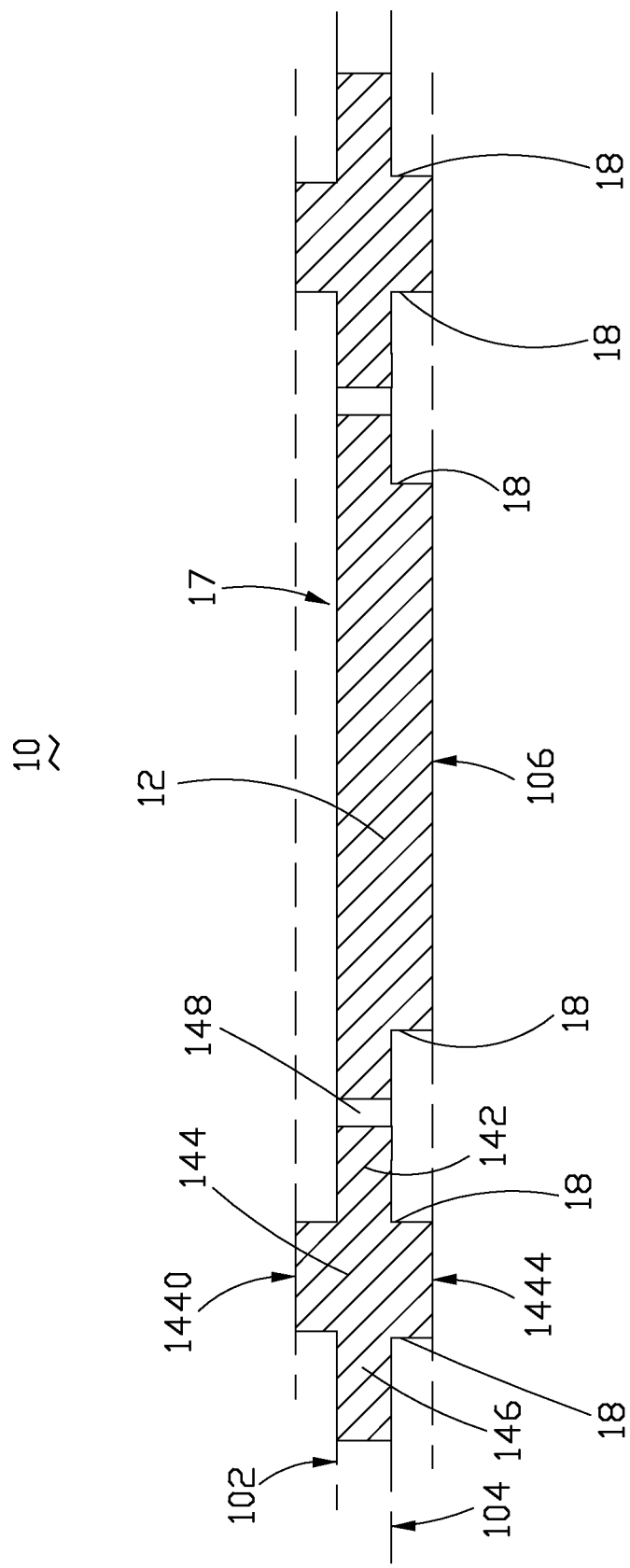
FIG. 4 is a cross-sectional view of the embodiment of the lead frame in accordance with the present disclosure.

Referring to FIG. 4, two opposite sides of the support end 142, the jointing end 146 and the frame portion 11 are configured on the first surface 102 and the second surface 104 respectively. The connecting terminal 144 protrudes away from the first surface 102 and the second surface 104 respectively. The connecting terminal 144 comprises a top surface 1440 and a bottom surface 1444 opposite to the top surface 1440. The top surface 1440 is protruding from the first surface 102 and the connecting terminals 144 surround the pad portion 12, thus, the connecting terminals 144, the support ends 142 and the pad portion 12 collectively define a receiving portion 17 for receiving the semiconductor elements. The connecting terminals 144 and the pad portion 12 protrude away from the second surface 104 to form a plurality of step portions 18. The bottom surface 1444 is substantially parallel with the second surface 104 and coplanar with the third surface 106, the plurality of step portions 18 are formed on the lead portion 14 and the pad portion 12. In the illustrated embodiment, the plurality of step portions 18 are formed by half-etching. The plurality of step portions 18 can be filled with encapsulating material to improve waterproof capability for the lead frame 10 when the lead frame 10 is encapsulated by encapsulating material.

A method of manufacturing the lead frame 10 will be described below.

The lead frame 10 is formed by etching or stamping the metal plate to have a structure comprising the frame portion 11 having a hollow rectangular structure, the pad portion 12 at the center of the frame portion 11 for mounting the semiconductor elements on, the plurality of support bars 13 connecting the pad portion 12 to four corners of the rectangular structure of the frame portion 11, and the plurality of lead portions 14 peripherally extending from four sides of the rectangular structure of the frame portion 11 towards the pad portion 12.

The lead frame 10 comprises the first surface 102 and the second surface 104 opposite to the first surface 102. One sides of the frame portion 11, the pad portion 12 and the plurality of support bars 13 collectively form the first surface 102, another sides, opposite to said one sides, of the frame portion 11 and the plurality of support bars 13 collectively form the second surface 104, and another side of the pad portion 12 protrudes from the second surface 104.

Each of the plurality of lead portions 14 is etched to form the support end 142, the connecting terminal 144 and the jointing end 146. The jointing end 146 joints the frame portion 11 with the connecting terminal 144, the connecting terminal 144 is disposed between the jointing end 146 and the support end 142. Two opposite sides of the support end 142, the jointing end 146 and the frame portion 11 are configured on the first surface 102 and the second surface 104 respectively. The connecting terminal 144 has the top surface 1440 protruding from the first surface 102 to surround the pad portion 12, thus, the connecting terminals 144, the support ends 142 and the pad portion 12 collectively define a receiving portion 17 for receiving the semiconductor elements.

In each receiving space defined by the frame portion 11, the pad portion 12 and the support bar 13, the plurality of lead portions 14 are etched to space with each other with the first gaps 147 of width W, and to space with the pad portion 12 with the second gaps 148 of width C1 and the third gaps 149 of width C2, as shown in FIG. 3.

The pad portion 12 is etched to form the projection stage 124 protruding outwardly from the second surface 104 to prevent the pad portion 12 from a load stress from the semiconductor elements. The projection stage 124 has the third surface 106 in parallel with the second surface 104. The connecting terminal 144 further has the bottom surface 1444 opposite to the top surface 1440. The bottom surface 1444 is substantially parallel with the second surface 104 and coplanar with the third surface 106, the plurality of step portions 18 are formed on the lead portions 14 and the pad portion 12 by half-etching. The plurality of step portions 18 are located between the second surface 104 and the bottom surface 1444 as well as between the second surface 104 and the third surface 106, to be filled with encapsulating material so as to completely stick the encapsulating material to the lead frame 10 when the lead frame 10 is encapsulated.

Figure 5:
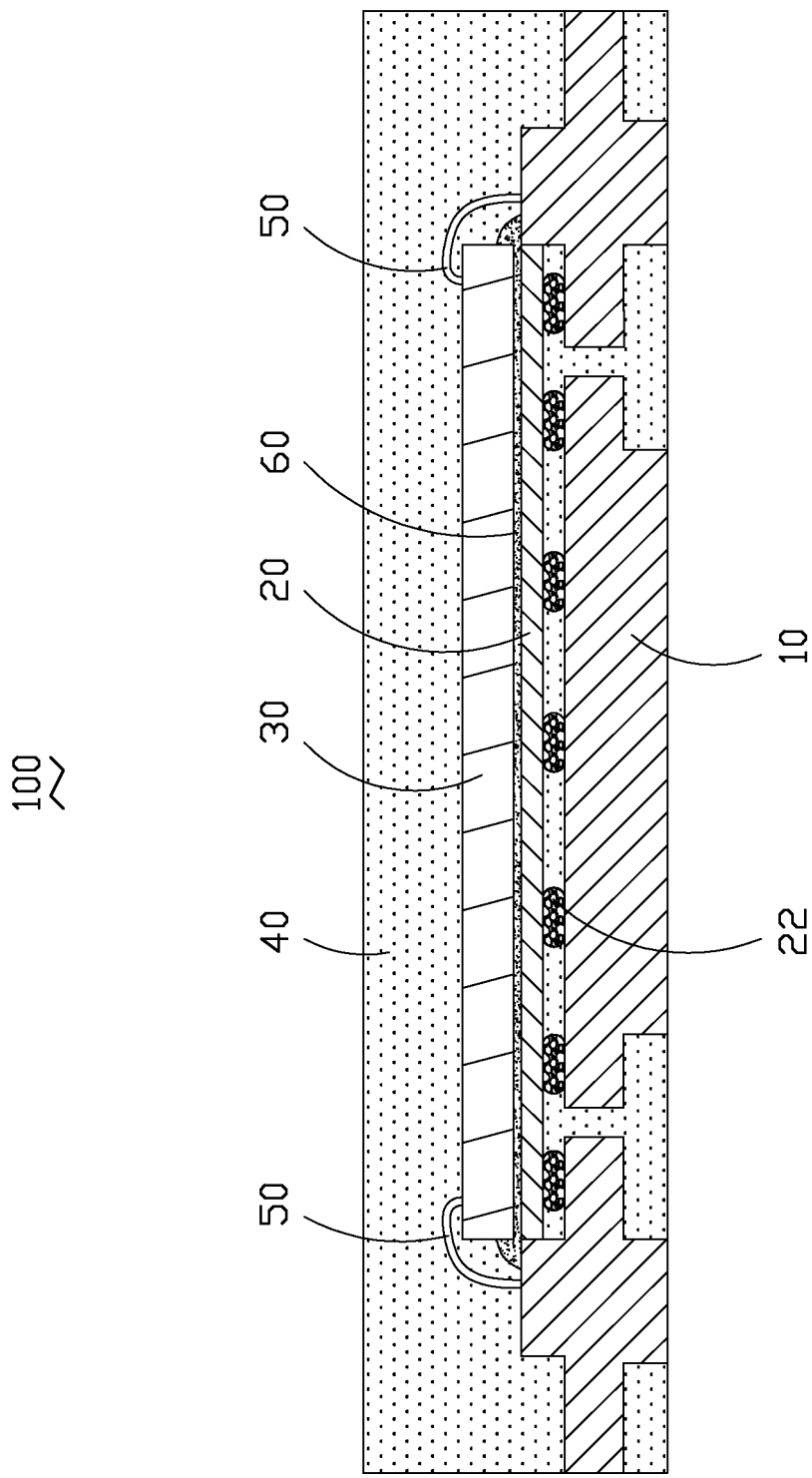
FIG. 5 is a cross-sectional view of an embodiment of a semiconductor package in accordance with the present disclosure.
Figure 6:
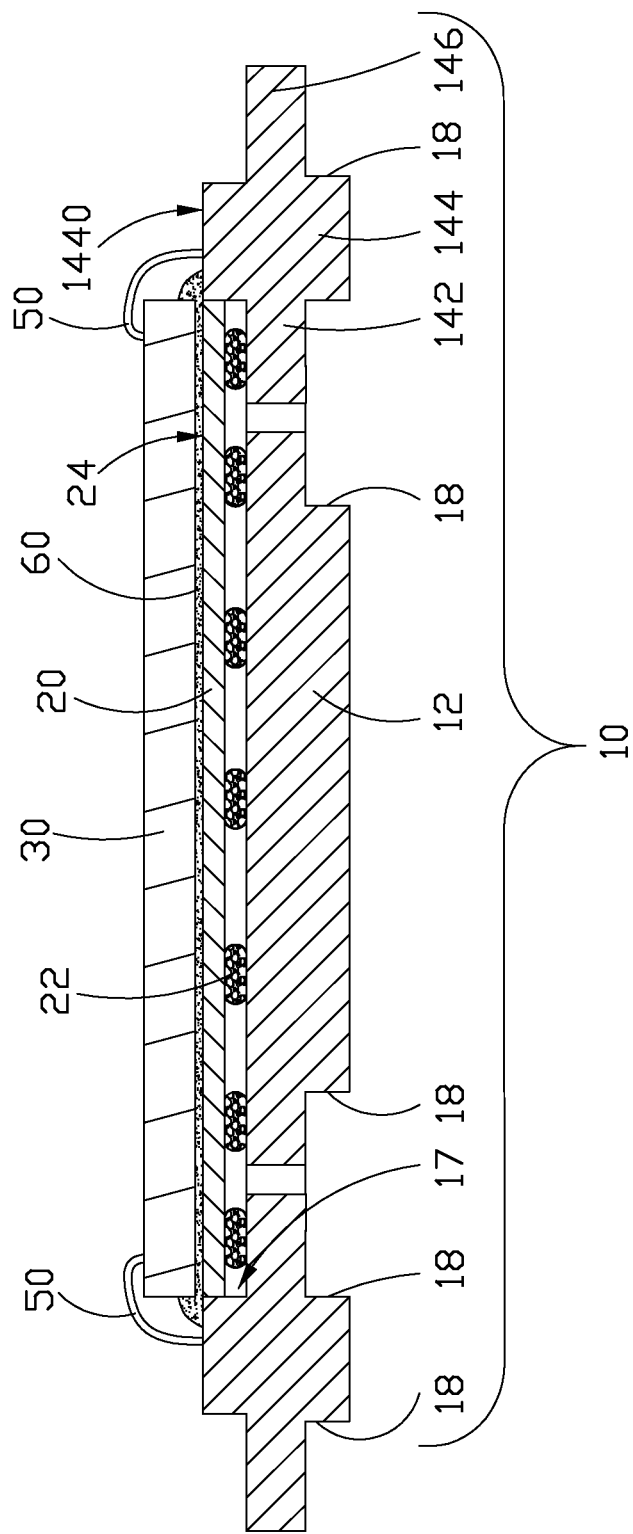
FIG. 6 is a cross-sectional view of the embodiment of the semiconductor package without mold compound in accordance with the present disclosure.

Referring to FIG. 5, a semiconductor package 100, such as a quad flat non-leaded package (QFN), comprises the lead frame 10, a first chip 20, a second chip 30, a mold compound 40 and a plurality of bonding wires 50.

The lead frame 10 is adhered with an adhesive tape (not shown) on the bottom surface 1444 of the connecting terminal 144 and the third surface 106. The adhesive tape is used to securely mount the pad portion 12 and the plurality of lead portions 14 to avoid the mold compound 40 overflowing the lead frame 10.

The first chip 20 is securely received in the receiving portion 17. A plurality of solder balls 22 electrically connect the first chip 20 with the pad portion 12. A surface of the first chip 20 away from the pad portion 12 is substantially in parallel with the top surface 1440 of the connecting terminals 144, that is, the said surface of the first chip 20 may be lower than the top surface 1440.

The second chip 30 is mechanically attached to the first chip 20. In the illustrated embodiment, the second chip 30 is mounted on the first chip 20 via an adhesive 24. The adhesive 24 may be an adhesive film, an epoxy resin, for example, to further improved heat dissipation of the second chip 30.

The second chip 30 is electrically connected to the plurality of lead portions 14 via the plurality of bonding wires 50 so as to electrically connect to the lead frame 10, and particularly to connecting terminals 144. In the illustrated embodiment, each of the plurality of bonding wires 50 is a gold wire.

The mold compound 40 encapsulates the lead frame 10, the first chip 20, the second chip 30 and the plurality of bonding wires 50 to form the semiconductor package 100. The mold compound 40 is filled in the plurality of step portions 18 of the lead frame 10, in the first gaps 147 between the lead portions 14 and in the second gaps 148 and the third gaps 149 between the lead portions 14 and the pad portion 12. The mold compound 40 is substantially coplanar with the bottom surface 1444 as well as the third surface 106 by the means of the adhesive tape. After the mold compound 40 is solidified, the adhesive tape is pulled apart from the lead frame 10. In the illustrated embodiment, the mold compound 40 is made of non-conductive material, such as black gum or plastic.

As the first chip 20 is completely received in the receiving portion 17 of the lead frame 10, height of the semiconductor package 100 is shortened so as to reduce volume of the semiconductor package 100.

By filling the mold compound 40 in the plurality of step portions 18 of the lead frame 10, in the first gaps 147 between the lead portions 14 and in the second gaps 148 and the third gaps 149 between the lead portions 14 and the pad portion 12, the mold compound 40 can be securely mounted on the lead frame 10 to improve the waterproof capability of the semiconductor package 100.

Although the features and elements of the present disclosure are described as embodiments in particular combinations, each feature or element can be used alone or in other various combinations within the principles of the present disclosure to the full extent indicated by the broad general meaning of the terms in which the appended claims are expressed.

What is claimed is:

1. A lead frame, comprising:
   a frame portion comprising a first surface and a second surface opposite to the first surface;
   a pad portion at a center of the lead frame to support semiconductor elements;
   a plurality of support bars connecting the pad portion to corners of the frame portion; and
   a plurality of lead portions, peripherally extending from the frame portion towards the pad portion, each of the plurality of lead portions comprising a support end, a connecting terminal and a jointing end, the jointing end jointing the frame portion with the connecting terminal, and the connecting terminal being disposed between the jointing end and the support end;
   wherein the support ends and the jointing ends are configured on the first surface, the connecting terminal protrudes away from the first surface, the connecting terminals, the support ends and the pad portion collectively define a receiving portion, and the connecting terminal and the pad portion protrude away from the second surface to form a plurality of step portions.

2. The lead frame as claimed in claim 1, wherein the plurality of lead portions are spaced from each other with a first gap and spaced from the pad portion with a second gap.

3. The lead frame as claimed in claim 2, wherein at least one lead portion only comprises the jointing end and the connecting terminal, and is spaced from the pad portion with a third gap.

4. A semiconductor package, comprising:
a lead frame, comprising a pad portion at a center of the lead frame and a plurality of lead portions, the pad portion and the plurality of lead portions collectively defining a receiving portion;
a first chip, securely received in the receiving portion;
a second chip, mechanically attached to the first chip;
a plurality of bonding wires, electrically connecting the second chip to the plurality of lead portions; and
a mold compound, encapsulating the lead frame, the first chip, the second chip and the plurality of bonding wires.

5. The semiconductor package as claimed in claim 4, wherein the lead frame comprises a frame portion having a hollow rectangular structure, and the plurality of lead portions peripherally extend from four sides of the rectangular structure of the frame portion towards the pad portion.

6. The semiconductor package as claimed in claim 5, wherein each of the plurality of lead portions comprises a support end, a connecting terminal and a jointing end, the jointing end joints the frame portion with the connecting terminal, and the connecting terminal is disposed between the support end and the jointing end.

7. The semiconductor package as claimed in claim 6, wherein the lead frame has a first surface and a second surface opposite to the first surface, and one side of the frame portion, the pad portion, the support ends and the jointing ends are configured on the first surface.

8. The semiconductor package as claimed in claim 7, wherein the connecting terminal and the pad portion protrude away from the second surface to form a plurality of step portions.

9. The semiconductor package as claimed in claim 4, wherein the lead frame comprises a plurality of support bars connecting the pad portion to corners of the frame portion, and one side of the frame portion, the pad portion and the plurality of support bars collectively form the first surface.

10. The semiconductor package as claimed in claim 9, wherein the plurality of lead portions are spaced from each other with a first gap and spaced from the pad portion with a second gap.

11. The semiconductor package as claimed in claim 4, wherein each of the plurality of bonding wires is a gold wire.

12. The semiconductor package as claimed in claim 4, wherein the second chip is mounted on the first chip via an adhesive.

* * * * *